United States Patent [19]

Abdi et al.

[11] Patent Number: 5,734,276
[45] Date of Patent: Mar. 31, 1998

[54] CIRCUIT AND METHOD FOR REDUCING DISTORTION IN A TRACK AND HOLD AMPLIFIER

[75] Inventors: Behrooz Abdi; Byron Bynum, both of Gilbert, Ariz.

[73] Assignee: Motorola, Inc., Schaumburg, Ill.

[21] Appl. No.: 603,142

[22] Filed: Feb. 20, 1996

[51] Int. Cl.$^6$ ................................................ G11C 27/02
[52] U.S. Cl. ........................................ 327/94; 327/309
[58] Field of Search ............................ 327/90, 91, 94, 327/95, 96, 337, 309, 312, 317, 318, 321, 554, 382

[56] References Cited

U.S. PATENT DOCUMENTS

| | | | |
|---|---|---|---|
| 5,130,572 | 7/1992 | Stitt et al. | 327/96 |
| 5,134,313 | 7/1992 | Umeyama et al. | 327/94 |
| 5,315,168 | 5/1994 | Norton, Jr. | 327/91 |
| 5,410,195 | 4/1995 | Ichihara | 327/94 |
| 5,502,410 | 3/1996 | Dunn et al. | 327/94 |
| 5,510,736 | 4/1996 | Van De Plassche | 327/96 |
| 5,517,141 | 5/1996 | Abdi et al. | 327/96 |

*Primary Examiner*—Timothy P. Callahan
*Assistant Examiner*—My-Trang Nu Ton
*Attorney, Agent, or Firm*—Sharon K. Coleman; Gary W. Hoshizaki

[57] ABSTRACT

Prior art differential track and hold amplifiers produce an error voltage when transitioning from a track mode to a hold mode. An error voltage limits the resolution of a track and hold amplifier. A first circuit (44) and a second circuit (45) couple a differential voltage to the storage capacitor. Control signals applied to the first and second circuits (44, 45) generate parasitic currents through parasitic capacitances which couple to a storage capacitor of a track and hold amplifier (41). The control signals applied to the first and second circuits (44, 45) are forced to transition an equal voltage magnitude to produce identical parasitic currents through the parasitic capacitance. Identical parasitic currents affect common mode voltage but do not change the differential voltage stored on the storage capacitor. A clamping circuit (50) clamps the voltage transition of the control signals to produce identical voltage transitions.

20 Claims, 4 Drawing Sheets

- PRIOR ART -

CIRCUIT AND METHOD FOR REDUCING DISTORTION IN A TRACK AND HOLD AMPLIFIER

CROSS REFERENCE TO RELATED PATENT APPLICATIONS

The present application is related to copending U.S. patent application Ser. No. 08/400,686, now U.S. Pat. No. 5,517,141, entitled "DIFFERENTIAL HIGH SPEED TRACK AND HOLD AMPLIFIER", filed Nov. 5, 1993, by "Behrooz Abdi and Gary Stuhlmiller" and assigned to the same assignee, Motorola Inc.

BACKGROUND OF THE INVENTION

This invention relates, in general, to track and hold amplifier circuits, and more particularly, to reducing distortion to increase the resolution of a track and hold amplifier circuit.

A track and hold amplifier circuit is a circuit for sampling a voltage, typically at some fixed clock rate. A storage capacitor is used to hold the voltage between samples. The storage capacitor voltage is buffered and provided for conversion to a digital value.

A track and hold amplifier circuit has two different modes of operation. In a track mode, the track and hold amplifier circuit couples an input voltage to a storage capacitor such that the voltage applied to the storage capacitor corresponds to the input voltage. In a hold mode, the storage capacitor is decoupled from the input voltage. A hold voltage on the storage capacitor corresponds to the input voltage at a point in time when the track and hold amplifier circuit goes into the hold mode. Typically, the voltage stored on the storage capacitor is the same as the input voltage or is multiplied to a larger voltage by a constant gain factor.

Distortion is any voltage added to or subtracted from the storage capacitor that changes the voltage from a correct value. The accuracy of the track and hold amplifier circuit is limited by the distortion component. In an application where the voltage on the storage capacitor is converted to a digital value, the distortion must be significantly less than the least significant bit to prevent error.

It would be of great benefit if a circuit and method could be provided that reduces distortion thereby increasing the accuracy of a track and hold amplifier circuit.

DETAILED DESCRIPTION OF THE DRAWINGS

An example of a use for a high speed track and hold amplifier is in a wideband cellular base station. A cellular base station has a limited portion of the Radio Frequency (RF) spectrum that is subdivided into a number of RF channels. For example, a 15 megahertz portion of the RF spectrum is subdivided into 16 RF channels, each capable of sending and receiving information. In prior art cellular base station systems, each RF channel had corresponding RF conversion circuitry and digital processing circuit.

Providing dedicated circuitry for each RF channel of a cellular base station is inefficient and expensive. A solution which reduces circuitry is to sample, digitize, and digitally process each channel through a single circuit. To achieve the circuitry savings a high resolution/high speed track and hold amplifier and analog to digital converter is required. For example, a track and hold amplifier having 14 bit resolution at 60 megahertz operation would make the digital conversion of the 15 megahertz portion of the RF spectrum subdivided into 16 channels feasible. Although track and hold amplifiers exist that operate at high speeds none have the resolution required. Thus, reducing distortion that causes voltage error in a high speed track and hold amplifier is an important factor in achieving high resolution.

Figure 1:
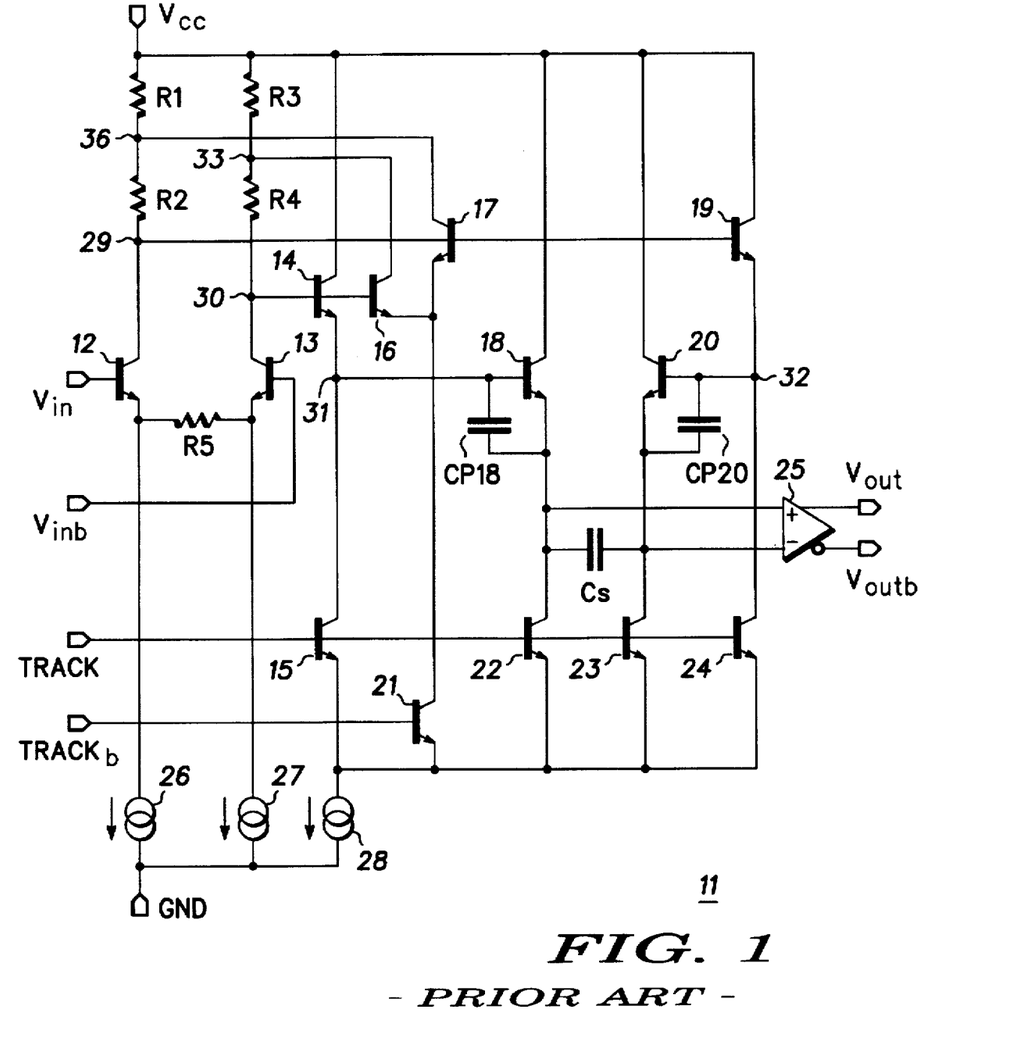
FIG. 1 is a prior art schematic diagram of a track and hold amplifier.

FIG. 1 is a prior art schematic diagram of a track and hold amplifier 11. Track and hold amplifier 11 is used to illustrate a distortion component common to track and hold amplifiers that limits accuracy. In a track mode, track and hold amplifier 11 couples a differential voltage to a storage capacitor Cs that corresponds to a differential input signal applied to inputs Vin and Vinb. In a hold mode, storage capacitor Cs is decoupled from the differential input signal to hold a voltage.

In general, a track and hold amplifier is part of a larger digital system. A track and hold amplifier is clocked to periodically sample a differential input signal and store a corresponding differential voltage on the storage capacitor Cs. The differential voltage stored on the storage capacitor Cs is either the same voltage magnitude of the differential input signal or amplified by a specific value. The voltage on the storage capacitor Cs is applied to an amplifier stage 25 which provides an output differential voltage at outputs Vout and Voutb.

Typically, track and hold amplifier 11 is used in a digital system. The output differential voltage is converted to a digital number (digitized) via an analog to digital converter (ADC) where it can be digitally processed by a digital system. The accuracy or resolution of track and hold amplifier 11 is affected by any voltage error added to or subtracted from the storage capacitor CS during a track and hold process.

In a track mode, a control signal is applied to a Track input that enables transistors 15, 22, 23, and 24. A control signal is applied to a Trackb input that disables transistor 21. Disabling transistor 21 prevents transistors 16 and 17 from being enabled.

Transistors 12 and 13, resistor R5, and current sources 26 and 27 form a differential input amplifier stage. Resistors R1, R2, R3, and R4 are resistor loads for the differential input amplifier stage. An amplified differential voltage is provided at nodes 29 and 30 of the differential input signal applied to Vin and Vinb. Transistors 14 and 18 are voltage followers that couple the voltage at node 30 to a first terminal of the storage capacitor Cs. Similarly, transistors 19 and 20 are voltage followers that couple the voltage at node 29 to a second terminal of the storage capacitor Cs. The differential voltage across storage capacitor Cs changes or follows the differential input signal applied to the inputs Vin and Vinb.

In a hold mode, the control signal applied to the Track input disables transistors 15, 22, 23, and 24. The control signal applied to the Trackb input enables transistor 21. Current from transistor 21 biases transistors 16 and 17 for respectively coupling current to resistors R1 and R2.

Transistors 18 and 20 are turned off to decouple the amplified differential voltage from the first and second terminals of the storage capacitor. The process of turning off transistors 18 and 20 is achieved by providing a current through transistors 16 and 17 respectively to resistors R1 and R3 which reduces the voltage at nodes 29 and 30. Transistor 16 has a collector connected to a node 33, a base connected to node 30, and an emitter connected to transistor 21. Transistor 17 has a collector connected to a node 32, a base connected to node 29, and an emitter connected to transistor 21. The base and collector connections of transistors 16 and 17 form a feedback path that forces nodes 29 and 30 to approximately equal voltages except for the base-emitter junction voltage difference due to the different operating currents. Transistors 14 and 19 respectively connect to nodes 30 and 29 and both are in a voltage follower configuration. Transistors 14 and 19 follow the voltage at nodes 29 and 30 thereby reducing the voltage at nodes 31 and 32. The voltage at nodes 31 and 32 is sufficient to turn off the base-emitter junctions of transistors 18 and 20.

An error voltage or distortion is added to the storage capacitor Cs when transistors 18 and 20 are turned off. Transistors 18 and 20 respectively have a parasitic capacitance CP18 and CP20 from base to emitter. Note that a differential voltage is stored on storage capacitor Cs which implies that the first and second terminals of the storage capacitor are at different voltages. Transistors 16 and 17 reduce the voltage at nodes 31 and 32 to an equal amount. The change in voltage across the base-emitter junctions of transistors of transistors 18 and 20 are unequal due to differential voltage stored on the storage capacitor Cs.

A change in voltage across a capacitor produces a current corresponding to the equation I=C*(dv/dt) where I is current, C is capacitance, dv/dt is the change in voltage over time. The change in voltage at nodes 31 and 32 respectively produces a current through parasitic capacitors CP18 and CP20. The currents are not equal since the change in voltage across the base-emitter junctions of transistors 18 and 20 are not equal. The current difference produced when turning off transistors 18 and 20 produces an error voltage on the storage capacitor Cs that limits accuracy of track and hold amplifier 11. Thus, any track and hold circuit that does not account for parasitic current produced when turning off devices which couple a differential voltage to a storage capacitor will have increased distortion.

Figure 2:
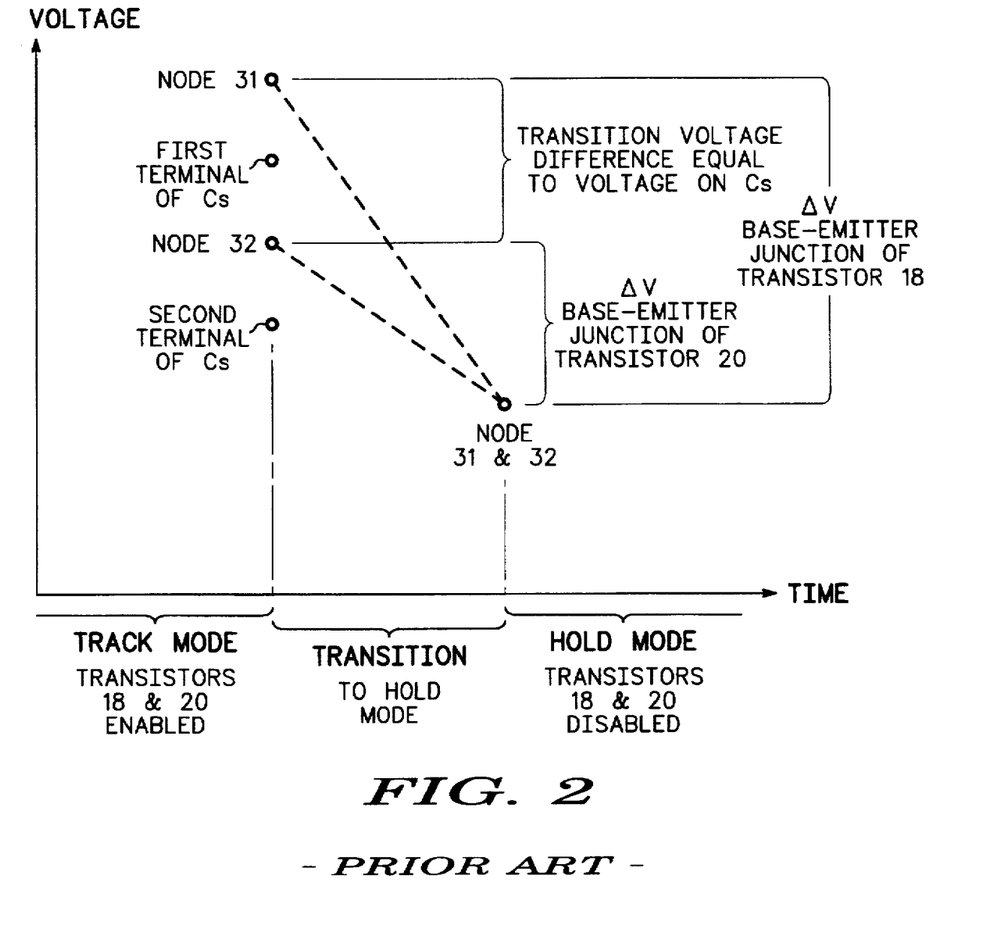
FIG. 2 is a graphical illustration of the change in voltage across the base-emitter junctions of transistors 18 and 20 of FIG. 1 when the track and hold amplifier transitions from a track mode to a hold mode.

FIG. 2 is a graphical illustration of the change in voltage across the base-emitter junctions of transistors 18 and 20 of FIG. 1 when transitioning from a track mode to a hold mode. FIG. 2 illustrates the difference in transition voltages when the input differential signal is decoupled from the storage capacitor Cs (FIG. 1) in prior art track and hold amplifiers. The difference in transition voltage produces currents through parasitic capacitances (CP18 and CP20 of FIG. 1) that produces an error voltage to storage capacitor Cs thereby limiting the accuracy of the track and hold amplifier.

In a track mode, transistors 18 and 20 are turned on, nodes 31 and 32 (FIG. 1) are respectively at a voltage greater than the first and second terminals of the storage capacitor Cs as shown in FIG. 2. In this example, the first terminal of the storage capacitor Cs is at a higher voltage potential than the second terminal.

Transistors 18 and 20 are turned off to hold the voltage on the storage capacitor Cs. The process of changing from a track mode to a hold mode is indicated by the wording "transition to hold mode" in FIG. 2. In this example, nodes 31 and 32 are brought to the same voltage potential which respectively reverse biases the base-emitter junctions of transistors 18 and 20. Since node 31 starts at a higher voltage potential the change in voltage across the base-emitter junction of transistor 18 is larger than the change in voltage across the base-emitter junction transistor 20. The difference in transition voltages of the base-emitter junctions of transistors 18 and 20 produces an error voltage on the storage capacitor Cs. Note that the difference in transition voltage is equal to the differential voltage on the storage capacitor Cs. The additional current coupled through parasitic capacitance CP18 reduces the differential voltage held by the storage capacitor Cs.

Figure 3:
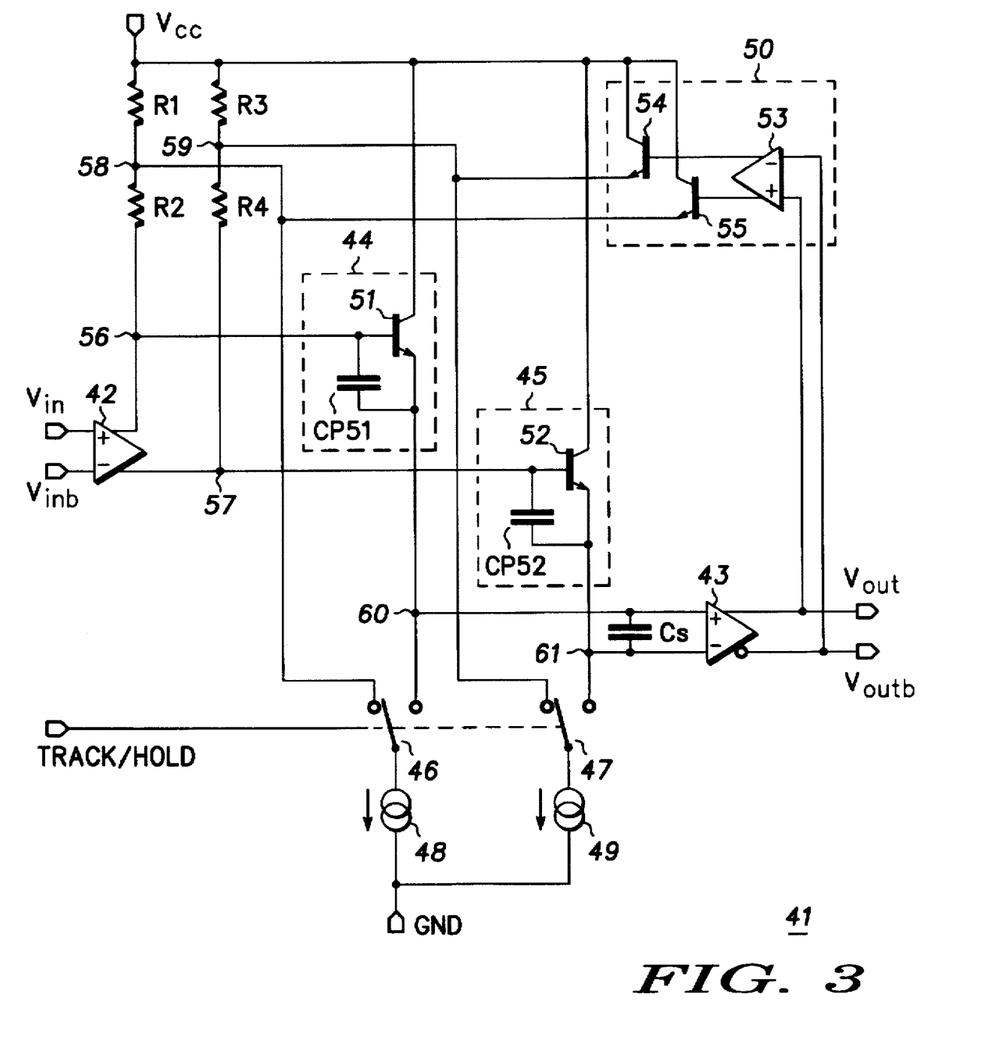
FIG. 3 is a block diagram of a track and hold amplifier that reduces distortion in accordance with the present invention.

FIG. 3 is a block diagram of a track and hold amplifier 41 that reduces distortion in accordance with the present invention. Differential track and hold circuits have circuitry which couple and decouple a differential voltage from a storage capacitor. Inherent to the circuitry that provides the differential voltage are parasitic capacitances that couple to the storage capacitor. Control signals that disable the circuitry providing the differential voltage produce currents that produce an error voltage on the storage capacitor when the track and hold circuits changes from a track mode to a hold mode.

The error voltage is substantially reduced by using identical or equal circuits for providing the voltage to either terminal of the storage capacitor. Matched circuits for providing the differential voltage have equal parasitic capacitance coupling to the storage capacitor. The currents produced through the parasitic capacitance are made equal by making the control signals that disable the matched circuits transition an equal voltage magnitude. Thus, identical currents are produced through the parasitic capacitances of the circuits which changes the voltage at either terminal of the storage capacitor an equal amount (changes common mode voltage) but does not affect the differential voltage across the storage capacitor. In other words, a common mode voltage is generated at the terminals of the storage capacitor through the parasitic capacitances.

Track and hold amplifier 41 is a differential track and hold circuit having an input Vin, an input Vinb, a Track/Hold input, an output Vout, and an output Voutb. Track and hold amplifier 41 comprises, an input amplifier stage 42, resistors R1, R2, R3, and R4, a first circuit 44, a second circuit 45, a switch 46, a switch 47, a current source 48, a current source 49, a storage capacitor Cs, an output amplifier stage 43, and a clamping circuit 50.

Input amplifier stage 42 is an amplification stage for amplifying a differential input signal applied to inputs Vin and Vinb. Input amplifier stage 42 has a first and a second input respectively connected to the inputs Vin and Vinb, and a first and a second output connected respectively to a node 56 and a node 57.

Resistors R1, R2, R3, and R4 form resistor loads for input amplifier stage 42. Resistor R1 has a first terminal connected to a first power terminal (Vcc) and a second terminal connected to a node 58. Resistor R2 has a first terminal connected to node 58 and a second terminal connected node 56. Resistors R1 and R2 form a voltage divider circuit. In a track mode, resistors R1 and R2 combine as a resistive load for input amplifier stage 42. Resistor R3 has a first terminal connected to the power supply terminal Vcc and a second terminal connected to a node 59. Resistor R4 has a first terminal connected to the node 59 and a second terminal connected to node 57. Resistors R3 and R4 form a voltage divider circuit. In a track mode, resistors R3 and R4 combine as a resistive load for input amplifier stage 42.

First circuit 44 couples a voltage from the first output of input amplifier stage 42 to the storage capacitor Cs. First circuit 44 has an input connected to node 56 and an output connected to a node 60. Similarly, second circuit 45 couples a voltage from the second output of input amplifier stage 42 to the storage capacitor Cs. Second circuit 45 has an input connected to node 57 and an output connected to a node 61. Storage capacitor Cs stores a differential voltage provided by first circuit 44 and second circuit 45. Storage capacitor Cs has a first terminal connected to node 60 and a second terminal connected to node 61.

Output amplifier stage 43 buffers the differential voltage on the storage capacitor Cs from any loading applied at the outputs Vout and Voutb. Output amplifier stage 43 has a first and a second input connected respectively to nodes 60 and 61, and a first and a second output connected respectively to the outputs Vout and Voutb.

Switch 46 connects a current to either resistor R1 or to first circuit 44. Switch 46 has a first terminal connected to node 58, a second terminal connected to node 60, a third terminal, and a control input connected for receiving a Track/Hold signal. Current source 48 provides the current to switch 46. Current source 48 has a first terminal connected to the third terminal of switch 46 and a second terminal connected to a second power supply terminal (e.g. gnd).

Switch 47 connects a current to either resistor R3 or to second circuit 45. Switch 47 has a first terminal connected to node 59, a second terminal connected to node 61, a third terminal, and a control input connected for receiving the Track/Hold signal. Current source 49 provides the current to switch 47. Current source 49 has a first terminal connected to the third terminal of switch 47 and a second terminal connected to the power supply terminal gnd. Switches 46 and 47 are easily implemented in integrated form. For example, switch 46 and 47 correspond to transistors 15, 21, 22, 23, 24, of FIG. 1.

A clamping circuit 50 forces the control signals applied to first circuit 44 and second circuit 45 to transition an equal voltage when track and hold amplifier 41 changes from the track mode to the hold mode. Clamping circuit 50 has a first and a second input connected respectively to the outputs Vout and Voutb, and a first and a second output connected respectively to nodes 58 and 59.

Track and hold amplifier 41 has two distinct modes of operation, a track mode and a hold mode. In a track mode, track and hold amplifier 41 tracks a differential input voltage applied to inputs Vin and Vinb. A differential voltage corresponding to the differential input voltage is applied across the storage capacitor Cs. A Track/Hold signal applied to the Track/Hold input enables switches 46 and 47 to respectively couple current from current sources 48 and 49 to first circuit 44 and second circuit 45.

Resistors R1 and R2 form a resistive load for input amplifier stage 42 at node 56. Similarly, resistors R3 and R4 form a resistive load for input amplifier stage 42 at node 57. First circuit 44 and second circuit 45 respectively couple a voltage from nodes 56 and 57 to the first and second terminals of the storage capacitor Cs.

In an embodiment of track and hold amplifier 41, first circuit 44 and second circuit 45 are transistors in a voltage follower configuration. In particular, first circuit 44 and second circuit 45 are respectively bipolar NPN transistors 51 and 52. Transistors 51 and 52 have a collector, a base, and an emitter corresponding respectively to a first electrode, a control electrode, and a second electrode. First circuit 44 comprises a transistor 51 having a collector connected to the power supply terminal Vcc, a base connected to node 56, and an emitter connected to node 60. Transistor 51 has a parasitic capacitance CP51 across the base-emitter junction. Second circuit 45 comprises a transistor 52 having a collector connected to the power supply terminal Vcc, a base connected to node 57, and an emitter connected to node 61. Transistor 52 has a parasitic capacitance CP52 across the base-emitter junction.

Output amplifier stage 43 amplifies or buffers the differential voltage across the storage capacitor Cs from any loading at outputs Vout and Voutb. Clamping circuit 50 is disabled in the track mode and does not affect resistors R1 and R3.

In a hold mode, the Track/Hold signal applied to switches 46 and 47 respectively diverts current from first circuit 44 and second circuit 45 to Resistors R1 and R3. In practice, the hold mode disables or turns off first circuit 44 and second circuit 45 from providing a differential voltage across the storage capacitor Cs. The storage capacitor Cs holds the differential voltage, typically for being digitized by an analog to digital converter. Inherent to integrated circuitry that couples a voltage from one node to another node are parasitic capacitances such as CP51 and CP52. Disabling first circuit 44 and second circuit 45 produces currents through CP51 and CP52 that if different can produce an error voltage or distortion across the differential voltage held by the storage capacitor Cs.

Clamping circuit 50 forces the voltage transition at the input of first circuit 44 to be equal to the voltage transition at the input of second circuit 45 by taking into account the differential voltage stored on the storage capacitor Cs. Clamping circuit 50 clamps the voltage at nodes 58 and 59 to have a differential voltage corresponding to the differential voltage on the storage capacitor Cs. Clamping circuit 50 also level shifts or common modes the voltage at nodes 58 and 59. Nodes 56 and 57 respectively follow nodes 58 and 59 and are offset by the differential voltage on the storage capacitor Cs. The common mode voltage at nodes 56 and 57 is reduced to a point that the base-emitter junctions of transistors 51 and 52 are turned off to place track and hold amplifier 41 in the hold mode.

In an embodiment of track and hold amplifier 41, clamping circuit 50 comprises an amplifier 53 and transistors 54 and 55. Amplifier 53 buffers and level shifts the differential voltage at the outputs Vout and Voutb. Amplifier 53 has a first and a second input respectively connected to the outputs Vout and Voutb, a first output, and a second output. Transistors 54 and 55 are bipolar NPN transistors in a voltage follower configuration that provide a low output impedance and further level shifting for reducing the common mode voltage at nodes 58 and 59. Transistors 54 and 55 have a collector, base, and emitter corresponding respectively to a first electrode, a control electrode, and a second electrode. Transistor 55 has a collector connected to the power supply terminal Vcc, a base connected to the first output of amplifier 53, and an emitter connected to node 58. Transistor 54 has a collector connected to the power supply terminal Vcc, a base connected to the second output of amplifier 53, and an emitter connected to node 59.

An example illustrates how clamping circuit 50 of track and hold amplifier 41 forces the nodes 56 and 57 to transition an equal voltage when track and hold amplifier 41 changes from the track mode to the hold mode. For simplicity of illustration assume all amplification stages (input amplifier stage 42, output amplifier stage 43, and amplifier 53) are unity gain. Current switches 46 and 47 respectively couple current from current sources 48 and 49 to resistors R1 and R3. The current from current sources 48 and 49 is sufficient to generate a voltage drop across resistors R1 and R3 that turns off the base-emitter junction of transistors 51 and 52 under worst case operating conditions. Output amplifier stage 43 provides a differential output voltage equal to the voltage stored on the storage capacitor Cs.

The voltage at nodes 56 and 57 transition corresponding to the change in voltage at nodes 58 and 59. Nodes 56 and 57 transition to a voltage that turns off the base-emitter junctions of transistors 51 and 52 thereby decoupling the storage capacitor Cs from the input differential voltage. In the prior art, nodes 56 and 57 transition to approximately the same voltage. The change in voltage across the base-emitter junctions is unequal since the emitters of transistors 51 and 52 are coupled to different voltages. The voltage difference of the emitter voltages of transistors 51 and 52 is the stored voltage across storage capacitor Cs. The voltage difference at the emitters of transistors 51 and 52 is compensated for by clamping circuit 50 which clamps the voltages at nodes 58 and 59 and offsets the voltage by the voltage stored on capacitor Cs.

Amplifier 53 receives a differential output voltage at outputs Vout and Voutb that corresponds to the voltage of the storage capacitor Cs. Amplifier 53 outputs a common mode voltage combined with an offset voltage corresponding to the voltage of the storage capacitor Cs. The output voltage of amplifier 53 is level shifted to a voltage that turns off the base-emitter junctions of transistors 51 and 52 yet are offset by the voltage of the storage capacitor Cs. Transistors 54 and 55 are in a voltage follower configuration. Transistors 54 and 55 further level shift the output voltage of amplifier 53 by a base-emitter junction voltage. Transistor 55 is not enabled until the voltage at node 58 falls a base-emitter junction voltage below the first output of amplifier 53. Similarly, transistor 54 is not enabled until the voltage at node 59 falls a base-emitter junction voltage below the second output of amplifier 53. Once enabled, transistors 54 and 55 respectively clamp the voltage at nodes 59 and 58 by providing excess current to current sources 49 and 48. For example, clamping circuit 50 clamps a voltage at node 58 at a higher voltage potential (equal to the voltage across the storage capacitor Cs) than node 59 when the voltage at node 60 is at a higher voltage potential than node 61. The result being that compensating for the different emitter voltages of transistors 51 and 52 insures that nodes 56 and 57 transition an equal voltage when changing from a track mode to a hold mode. Identical parasitic currents are pulled from transistors 51 and 52 as they are being turned off which affects the common mode voltage at nodes 60 and 61 but does not change the stored differential voltage on the storage capacitor Cs.

Figure 4:
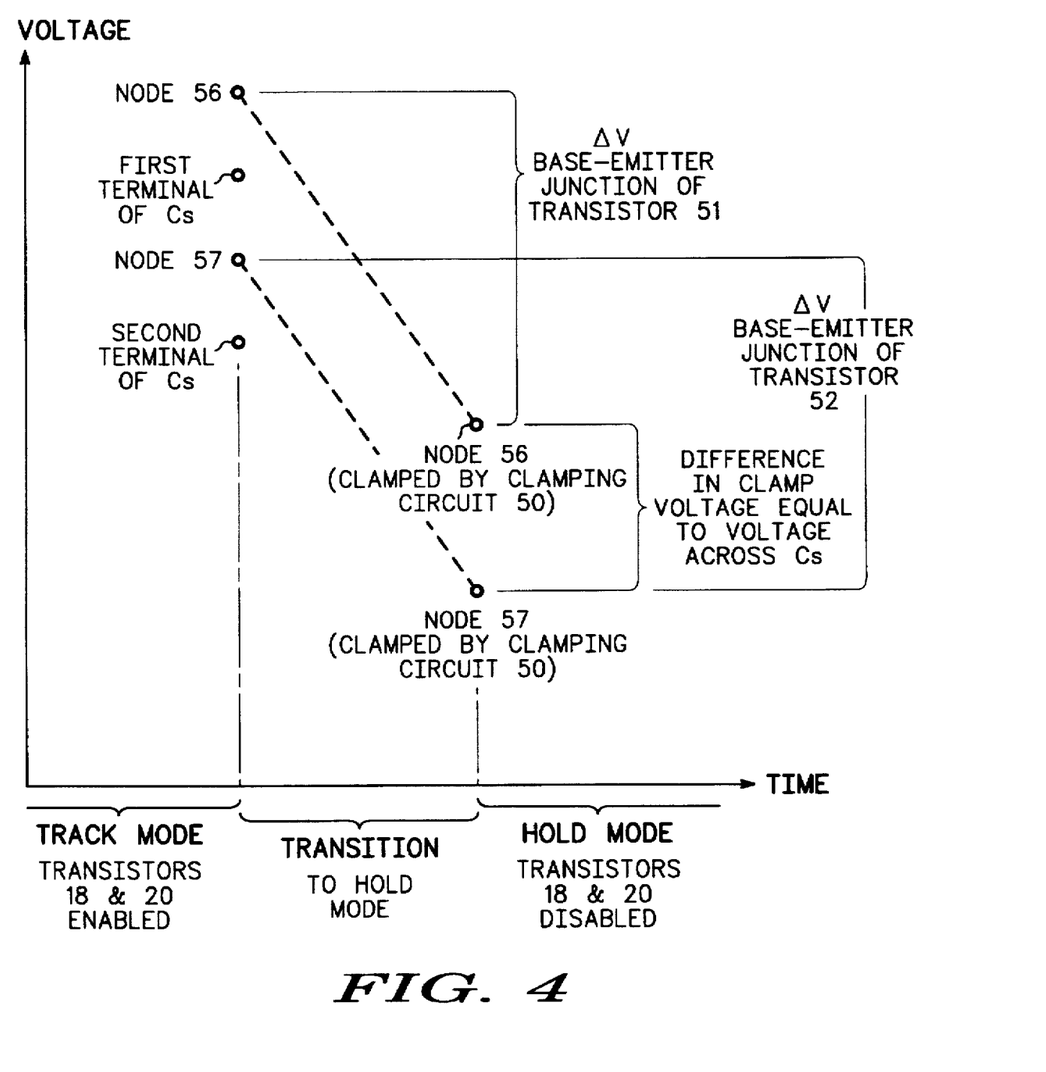
FIG. 4 is a graphical illustration of the equal change in voltage across the base-emitter junctions of transistors 51 and 52 of FIG. 3 when the track and hold amplifier transitions from a track mode to a hold mode in accordance with the present invention.

FIG. 4 is a graphical illustration of the equal, change in voltage across the base-emitter junctions of transistors 51 and 52 of FIG. 4 when the track and hold amplifier transitions from a track mode to a hold mode.

In a track mode, transistors 51 and 52 are turned on, nodes 56 and 57 (FIG. 3) are respectively at a voltage greater than the first and second terminals of the storage capacitor Cs (FIG. 3) as shown in FIG. 4. In this example, the first terminal of the storage capacitor Cs is at a higher voltage potential than the second terminal.

Transistors 51 and 52 of FIG. 3 are turned off or disabled to hold the voltage on the storage capacitor Cs in the hold mode. The process of changing from a track mode to a hold mode is indicated by the wording "transition to hold mode" in FIG. 4. In this example, nodes 56 and 57 are brought to a voltage potential which respectively reverse biases the base-emitter junctions of transistors 51 and 52. Clamping circuit 50 respectively clamps the voltage at nodes 58 and 59 (FIG. 3) to produce an offset voltage equal to the voltage on the storage capacitor Cs at nodes 56 and 57. The offset voltage as shown transitions node 56 to a higher voltage than node 57 yet both are clamped at a voltage sufficient to respectively turn off transistors 51 and 52. The offset voltage produces equal voltage transitions across the base-emitter junction as transistors 51 and 52 are turned off. Equal voltage transitions, produces equal parasitic currents through parasitic capacitances CP51 and CP52 which affects the common mode voltage at nodes 60 and 61 (FIG. 3) but does not affect the differential voltage held by the storage capacitor Cs. The reduction in voltage error increases the accuracy of the stored voltage on the storage capacitor Cs and allows a higher resolution analog to digital conversion to be used.

By now it should be appreciated that a track and hold amplifier and method has been provided that reduces distortion on a storage capacitor. A clamping circuit is provided that clamps the control signals that turn off circuitry that couple a differential voltage to a storage capacitor. The clamping circuit couples to the output of the track and hold amplifier to clamp the control signals with an offset voltage corresponding to the voltage stored on the storage capacitor. The offset voltage forces the control signals to transition an equal voltage magnitude thereby generating equal parasitic currents which affects common mode voltage but not the stored differential voltage on the storage capacitor.

The method decreases distortion by providing control signals to circuitry that couple and decouple a differential voltage to a storage capacitor. The control signals transition an equal voltage magnitude when the track and hold amplifier changes from a track mode to a hold mode.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A track and hold circuit comprising:

a storage capacitor having a first terminal and a second terminal;

a first circuit coupled to said first terminal of said storage capacitor;

a second circuit coupled to said second terminal of said storage capacitor; and a clamping circuit having a first input coupled to said first terminal of said storage capacitor, a second input coupled to said second terminal of said storage capacitor, and a first and a second output coupled respectively to said first circuit and said second circuit;

wherein a differential voltage is applied across said storage capacitor by said first and second circuits corresponding to a differential input signal of the track and hold circuit and wherein said first and second circuits are respectively disabled by a first and a second control signal output respectively from said first and second outputs of said clamping circuit, wherein said first control signal and said second control signal change an equal voltage magnitude when the track and hold circuit changes from a track mode to a hold mode to minimize distortion added to said storage capacitor by said first and second circuits.

2. A track and hold circuit as recited in claim 1 further including an input amplifier stage having a first input, a second input, a first output coupled to an input of said first circuit, and a second output coupled to an input of said second circuit wherein said differential input signal is applied across said first and second inputs of said input amplifier stage.

3. A track and hold circuit as recited in claim 2 wherein said first circuit comprises a transistor having a first electrode coupled to a first power supply terminal, a control electrode coupled to said input of said first circuit, and a second electrode coupled to said first terminal of said storage capacitor.

4. A track and hold circuit as recited in claim 3 wherein said second circuit comprises a transistor having a first electrode coupled to said first power supply terminal, a control electrode coupled to said input of said second circuit, and a second electrode coupled to said second terminal of said storage capacitor.

5. A track and hold circuit as recited in claim 4 further including:
- a first resistor having a first terminal coupled to said first power supply terminal and a second terminal; and
- a second resistor having a first terminal coupled to said second terminal of said first resistor and a second terminal coupled to said first output of said input amplifier stage wherein said first and second resistors form a first voltage divider network.

6. A track and hold circuit as recited in claim 5 further including:
- a third resistor having a first terminal coupled to said first power supply terminal and a second terminal; and
- a fourth resistor having a first terminal coupled to said second terminal of said third resistor and a second terminal coupled to said second output of said input amplifier stage wherein said third and fourth resistors form a second voltage divider network.

7. A track and hold circuit as recited in claim 6 further including:
- a first current source having a first terminal and a second terminal coupled to a second power supply terminal;
- a second current source having a first terminal and a second terminal coupled to said second power supply terminal;
- a first switch for coupling said first current source to said first voltage divider network when the track and hold circuit is in a hold mode and for coupling said first current source to said first circuit when the track and hold circuit is in a track mode, said first switch having a first terminal coupled to said second terminal of said first resistor, a second terminal coupled to said second electrode of said transistor of said first circuit, a third terminal coupled to said first terminal of said first current source, and a control input for receiving a track/hold control signal; and
- a second switch for coupling said second current source to said second voltage divider network when the track and hold circuit is in said hold mode and for coupling said second current source to said second circuit when the track and hold circuit is in said track mode, said second switch having a first terminal coupled to said second terminal of said third resistor, a second terminal coupled to said second electrode of said transistor of said second circuit, a third terminal coupled to said first terminal of said second current source, and a control input for receiving said track/hold control signal.

8. The track and hold circuit as recited in claim 7 further including an output amplifier stage having a first input coupled to said first terminal of said storage capacitor, a second input coupled to said second terminal of said storage capacitor, a first output, and a second output.

9. The track and hold circuit as recited in claim 8 wherein said clamping circuit clamps said first control signal and said second control signal to transition an equal voltage magnitude when the track and hold circuit changes from said track mode to said hold mode.

10. The track and hold circuit as recited in claim 9 wherein said clamping circuit comprises:
- an amplifier stage having a first input and a second input coupled respectively to said first and second input of said clamping circuit, a first output, and a second output;
- a first transistor having a first electrode coupled to said first power supply terminal, a control electrode coupled to said first output of said amplifier stage, and a second electrode coupled to said first output of said clamping circuit; and
- a second transistor having a first electrode coupled to said first power supply terminal, a control electrode coupled to said second output of said amplifier stage, and a second electrode coupled to said second output of said clamping circuit.

11. A track and hold circuit comprising:
- a first circuit having an input and an output;
- a second circuit having an input and an output;
- a storage capacitor having a first terminal coupled to said output of said first circuit and a second terminal coupled to said output of said second circuit wherein said first and second circuit couple a differential voltage corresponding to a differential input signal of the track and hold circuit to said storage capacitor during a track mode of the track and hold circuit; and
- a clamping circuit having a first and a second input coupled respectively to said first and second terminals of said storage capacitor, and a first output and a second output coupled respectively to said input of said first and second circuit, said clamping circuit clamping a voltage at said input of said first and second circuits such that a change in voltage at said input of said first and second circuit are equal when said differential voltage is decoupled from said storage capacitor during a hold mode of the track and hold circuit.

12. The track and hold circuit of claim 11 wherein said first circuit comprises a transistor having a first electrode coupled to a first power supply terminal, a control electrode coupled to said input of said first circuit, and a second electrode coupled to said output of said first circuit and wherein said second circuit comprises a transistor having a first electrode coupled to said first power supply terminal, a control electrode coupled to said input of said second circuit, and a second electrode coupled to said output of said second circuit.

13. The track and hold circuit of claim 12 further including:
- an input amplifier stage having a first input and a second input for receiving the differential input signal, and a first output and a second output coupled respectively to said input of said first and second circuit; and an output amplifier stage having a first input and a second input coupled respectively to said first and second terminals of said storage capacitor, and a first output and a second output coupled respectively to said first and second inputs of said clamping circuit.

14. The track and hold circuit of claim 13 wherein said clamping circuit comprises:

an amplifier having a first and a second input respectively coupling to said first and second inputs of said clamping circuit, a first output, and a second output;

a first transistor having a first electrode coupled to said first power supply terminal, a control electrode coupled to said first output of said amplifier, and a second electrode coupled to said first output of said clamping circuit; and a second transistor having a first electrode coupled to said first power supply terminal, a control electrode coupled to said second output of said amplifier, and a second electrode coupled to said second output of said clamping circuit.

15. The track and hold circuit of claim 14 further including:

a first resistor having a first terminal coupled to said first power supply terminal and a second terminal;

a second resistor having a first terminal coupled to said second terminal of said first resistor and a second terminal coupled to said input of said first circuit wherein said first and second resistors form a first voltage divider circuit;

a third resistor having a first terminal coupled to said first supply terminal and a second terminal;

a fourth resistor having a first terminal coupled to said second terminal of said third resistor and a second terminal coupled to said input of said second circuit wherein said third and fourth resistors form a second voltage divider circuit;

a first current source having a first terminal and a second terminal coupled to a second power supply terminal;

a first switch for coupling a current from said first current source to either said first voltage divider circuit or said first circuit, said first switch having a first terminal coupled to said second terminal of said first resistor, a second terminal coupled to said output of said first circuit, a control terminal, and third terminal coupled to said first terminal of said first current source;

a second current source having a first terminal and a second terminal coupled to said second power supply terminal; and a second switch for coupling a current from said second current source to either said second voltage divider circuit or said second circuit, said second switch having a first terminal coupled to said second terminal of said third resistor, a second terminal coupled to said output of said second circuit, a control terminal and a third terminal coupled to said first terminal of said second switch.

16. The track and hold circuit as recited in claim 15 wherein said first and second switch respectively couple said current from said first and second current source to said first and second voltage divider circuit during a hold mode of the track and hold circuit.

17. The track and hold circuit as recited in claim 16 wherein said first and second switch respectively couple said current from said first and second current source to said first and second circuit during a track mode of the track and hold circuit.

18. A method for reducing distortion in a differential track and hold circuit having a first circuit and a second circuit for coupling a differential voltage to a storage capacitor and a clamping circuit coupled to the first circuit, the second circuit, and the storage capacitor, the method comprising the steps of:

providing a first control signal and a second control signal to the first circuit and the second circuit, respectively;

when the differential track and hold circuit changes from a track mode to a hold mode, adjusting the first control signal and the second control signal, via the clamping circuit, such that a magnitude of the first control signal is equal to a magnitude of the second control signal; and producing a first current in the first circuit in response to the adjusted first control signal and a second current in the second circuit in response to the adjusted second control signal, wherein the first current is equal to the second current thereby reducing distortion in the track and hold circuit.

19. The method of claim 18 wherein the step of adjusting the first control signal and second control signal comprises the step of using the differential voltage coupled, to the storage capacitor to adjust the first control signal and second control signal.

20. The method of claim 19 wherein the step of adjusting the first control-signal and second control signal includes reducing a common mode voltage to place the track and hold amplifier in the hold mode.

* * * * *